(12) United States Patent
Orimoto et al.

(10) Patent No.: US 8,030,160 B2
(45) Date of Patent: Oct. 4, 2011

(54) METHODS OF FORMING NAND FLASH MEMORY WITH FIXED CHARGE

(75) Inventors: Takashi Orimoto, Sunnyvale, CA (US); George Matamis, San Jose, CA (US); Henry Chien, San Jose, CA (US); James Kai, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/729,874

(22) Filed: Mar. 23, 2010

(65) Prior Publication Data

US 2010/0178742 A1 Jul. 15, 2010

Related U.S. Application Data

(63) Continuation of application No. 11/692,961, filed on Mar. 29, 2007, now Pat. No. 7,732,275.

(51) Int. Cl.
*H01L 21/8247* (2006.01)
(52) U.S. Cl. ............................... 438/257; 257/E21.179
(58) Field of Classification Search .......... 438/257–267; 257/E21.179
See application file for complete search history.

(56) References Cited

U.S. PATENT DOCUMENTS

| | | | |
|---|---|---|---|
| 3,328,210 A | 6/1967 | McCaldin et al. | |
| 5,108,940 A | 4/1992 | Williams | |
| 5,264,380 A | 11/1993 | Pfiester | |
| 5,633,184 A | 5/1997 | Tamura et al. | |
| 5,923,976 A | 7/1999 | Kim | |
| 6,754,104 B2 | 6/2004 | King | |
| 6,790,755 B2 | 9/2004 | Jeon | |
| 6,888,755 B2 | 5/2005 | Harari | |
| 7,026,684 B2 | 4/2006 | Sakuma et al. | |
| 7,075,143 B2 | 7/2006 | Fujiwara et al. | |
| 7,157,769 B2 | 1/2007 | Forbes | |
| 7,164,603 B2 | 1/2007 | Shih et al. | |
| 7,282,409 B2 * | 10/2007 | Mouli | 438/257 |
| 7,494,870 B2 | 2/2009 | Chien | |
| 7,495,282 B2 | 2/2009 | Orimoto | |
| 7,619,926 B2 | 11/2009 | Orimoto et al. | |
| 2002/0014645 A1 | 2/2002 | Kobayashi | |
| 2004/0058489 A1 | 3/2004 | Arai | |
| 2004/0079988 A1 | 4/2004 | Harari | |
| 2004/0132261 A1 | 7/2004 | Cho | |
| 2004/0164340 A1 | 8/2004 | Arai | |
| 2005/0006696 A1 | 1/2005 | Noguchi et al. | |
| 2005/0184327 A1 | 8/2005 | Ozawa | |
| 2005/0199939 A1 | 9/2005 | Lutze et al. | |
| 2006/0044872 A1 | 3/2006 | Nazarian | |
| 2006/0060929 A1 | 3/2006 | Buh et al. | |

(Continued)

OTHER PUBLICATIONS

International Search Report and Written Opinion dated May 28, 2008 in PCT Application No. PCT/US2007/088145.

(Continued)

*Primary Examiner* — Richard A. Booth
(74) *Attorney, Agent, or Firm* — Vierra Magen Marcus & DeNiro LLP

(57) ABSTRACT

A string of nonvolatile memory cells connected in series includes fixed charges located between floating gates and the underlying substrate surface. Such a fixed charge affects distribution of charge carriers in an underlying portion of the substrate and thus affects threshold voltage of a device. A fixed charge layer may extend over source/drain regions also.

19 Claims, 4 Drawing Sheets

U.S. PATENT DOCUMENTS

| | | |
|---|---|---|
| 2006/0138478 A1 | 6/2006 | Buh et al. |
| 2006/0145254 A1 | 7/2006 | Buh et al. |
| 2006/0194388 A1 | 8/2006 | Hashimoto |
| 2006/0211205 A1 | 9/2006 | Jeon |
| 2006/0228841 A1 | 10/2006 | Kim et al. |
| 2006/0244047 A1 | 11/2006 | Gopalakrishnan et al. |
| 2006/0245246 A1 | 11/2006 | Lung |
| 2006/0267067 A1 | 11/2006 | Ishihara |
| 2006/0292802 A1 | 12/2006 | Lee et al. |

OTHER PUBLICATIONS

Response to Office Action dated Jun. 30, 2008 in U.S. Appl. No. 11/692,958.

Office Action dated Oct. 3, 2008 in U.S. Appl. No. 11/692,958.

Tsividis, Y., "Operation and Modeling of the MOS Transistor," 2nd Ed., MacGraw-Hill, 1999, pp. 51-54.

Response to Non-Final Office Action dated Jan. 5, 2009, U.S. Appl. No. 11/692,958, filed Mar. 29, 2007.

B. Deal, "Standardized Terminology for Oxide Charges Associated with Thermally Oxidized Silicon", Journal of the Electrochemical Society: Solid-State Science and Technology, Apr. 1980, pp. 979-981, vol. 127, No. 4.

Office Action dated Apr. 30, 2009 in U.S. Appl. No. 11/692,958.

Response to Office Action filed Jul. 23, 2009 in U.S. Appl. No. 11/692,958.

Notice of Allowance and Fee(s) Due dated Aug. 24, 2009 in U.S. Appl. No. 11/692,958.

Office Action dated Apr. 28, 2009 in U.S. Appl. No. 11/692,961.

Response to Office Action filed Jul. 23, 2009 in U.S. Appl. No. 11/692,961.

S.A. Campbell, The Science of Engineering of Microelectronic Fabrication, Oxford University Press, 2nd Ed., 2001.

R. Waser, Nanoelectronics and Information Technology, Wiley-VCH, 2nd Ed., 2005.

Office Action dated Apr. 16, 2008 in U.S. Appl. No. 11/692,958.

Response to Office Action mailed Jun. 30, 2008 in U.S. Appl. No. 11/692,958.

Office Action dated Oct. 1, 2007 in U.S. Appl. No. 11/692,958.

Response to Office Action mailed Jan. 2, 2008 in U.S. Appl. No. 11/692,958.

Shoji et al., A Novel EPROM Device Fabricated Using Focused Boron Ion-Beam Implantation, IEEE transaction on Electron Devices, vol. ED-34, No. 6, Jun. 1987, pp. 1264-1270.

Quirk et al., Semconductor Manufacturing Technology, 2001, Prentice Hall, pp. 233-234, ISBN 0-13-081520-9.

Buh, G.H., Interface States as an Active Component for 20 nm Gate-Length Planar MOSFET with Electro-Static Channel Extension (ESCE), IEEE, 2005, 4 pages.

Office Action dated Nov. 2, 2009 in U.S. Appl. No. 11/692,961.

Response to Office Action filed Dec. 31, 2009 in U.S. Appl. No. 11/692,961.

Notice of Allowance and Fee(s) Due dated Jan. 26, 2010 in U.S. Appl. No. 11/692,961.

Amendment Under 37 C.F.R. § 1.312(a) filed Mar. 4, 2010 in U.S. Appl. No. 11/692,961.

Amendment Under 37 C.F.R. § 1.312(a) filed Sep. 18, 2009 in U.S. Appl. No. 11/692,958.

\* cited by examiner

METHODS OF FORMING NAND FLASH MEMORY WITH FIXED CHARGE

CLAIM OF PRIORITY

This application is a continuation of U.S. patent application Ser. No. 11/692,961, now U.S. Pat. No. 7,732,275, entitled "Methods of Forming NAND Flash Memory With Fixed Charge," filed on Mar. 29, 2007, incorporated herein by reference.

BACKGROUND OF THE INVENTION

This invention relates to nonvolatile memories and methods of forming nonvolatile memories. In particular, this application relates to nonvolatile memory arrays in which a series of floating gate memory cells are electrically connected in series.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell.

SUMMARY OF THE INVENTION

A NAND flash memory array according to an embodiment of the present invention comprises: a plurality of floating gate memory cells connected in series by conductive source/drain regions, an individual floating gate memory cell including a floating gate and a fixed charge layer portion, the fixed charge layer portion located between the floating gate and an underlying substrate surface.

A NAND flash memory die according to an embodiment of the present invention comprises: a plurality of NAND strings formed on the die, an individual NAND string including floating gate memory cells connected together in series, an individual floating gate memory cell having a first fixed charge located between a floating gate and an underlying channel region, the first fixed charge affecting the threshold voltage of the floating gate memory cell, the floating gate memory cell having two control gates coupled to the floating gate.

A method of forming a NAND flash memory array according to an embodiment of the present invention comprises: forming a fixed charge layer that extends over a surface of a substrate; forming a plurality of floating gates overlying the fixed charge layer; and forming a plurality of conductive source/drain regions in areas of the substrate between floating gates, the source/drain regions connecting memory cells in series as a NAND string.

A method of forming a NAND flash memory according to an embodiment of the present invention comprises: forming a dielectric layer over a surface of a substrate; performing a plasma nitridation process on the dielectric layer; forming a plurality of floating gates over the nitrided dielectric layer; and forming a plurality of control gates that are individually interposed between neighboring floating gates of the plurality of floating gates.

BRIEF DESCRIPTION OF THE DRAWINGS

FIG. 1 also shows source/drain regions underlying control gates, the source/drain regions formed by implantation.

DETAILED DESCRIPTION OF ILLUSTRATED EMBODIMENTS

Figure 1:
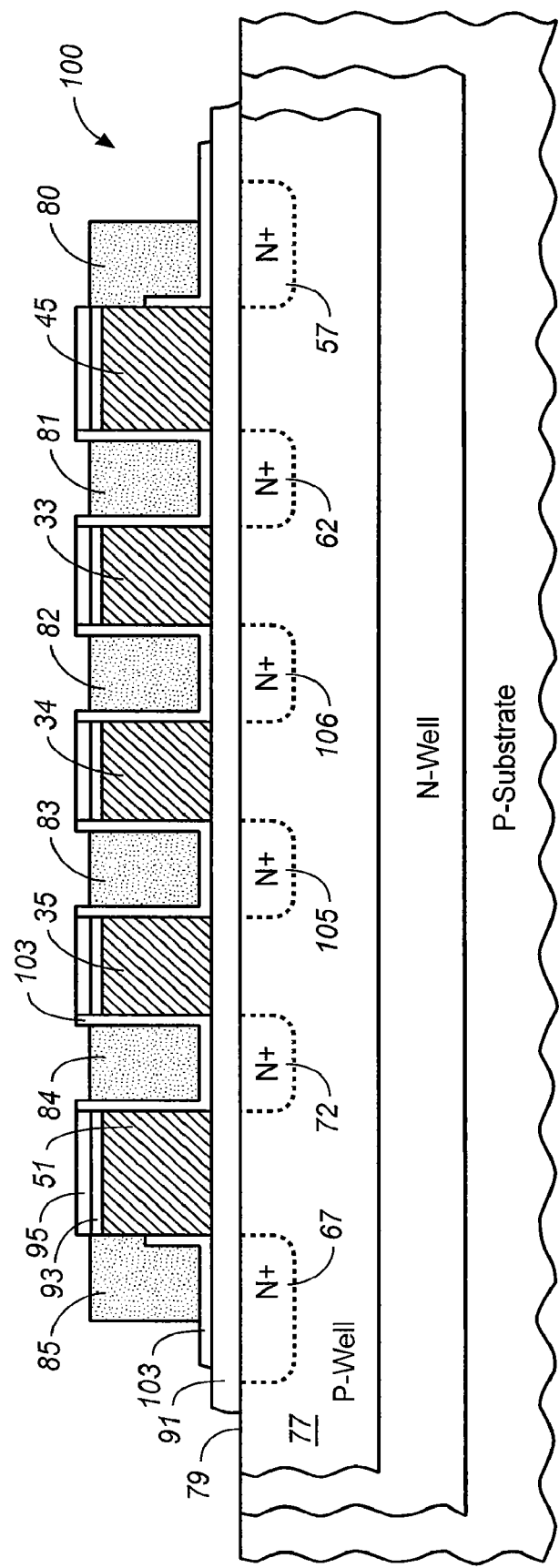
FIG. 1 shows a cross section of a NAND string having control gates extending between floating gates so that two control gates couple to each floating gate.

FIG. 1 shows a cross section of a NAND flash memory string 100 that has control gates 81-84 extending on both sides of floating gates 33-35 (this type of array is sometimes referred to as ENAND). Examples of such strings and methods of forming them are described in U.S. Pat. No. 6,888,755. In string 100 of FIG. 1 a floating gate is coupled to two control gates, one on either side of the control gate (e.g. floating gate 34 is coupled to control gates 82 and 83). This is in contrast to a common memory design where a control gate overlies a floating gate so that each floating gate is coupled to only one control gate. A memory string such as that of FIG. 1 may be formed as part of a memory array having many strings. Neighboring strings may be isolated from each other by Shallow Trench Isolation (STI) structures, or other means (not shown in FIG. 1). In some cases, individual stings may have 8, 16, 32 or more memory cells connected together in series. Select gates 45, 51 are provided at either end of string 100 and are connected to select lines 80, 85 to allow string 100 to be connected to circuits used for accessing the memory cells of string 100. Floating gates 33-35 are separated from substrate 77 by a gate dielectric (tunnel oxide) layer 91 overlying substrate surface 79.

In string 100 of FIG. 1, source/drain regions 57, 62, 67, 72, 105, 106 are provided in substrate 77 on either side of floating gates. Source/drain regions 57, 62, 67, 72, 105, 106 are shared by neighboring memory cells and provide an electrically conductive pathway between memory cells so that the memory cells in string 100 may be connected in series. Source/drain regions 57, 62, 67, 72, 105, 106 of FIG. 1 are formed by implantation using floating gates 33-35 and select gates 45, 51 to provide a mask so that source/drain regions 57, 62, 67, 72, 105, 106 are self-aligned to floating gates 33-35 and select gates 45, 51. Control gates 81-84 are then formed by depositing a conductive layer (e.g. doped polysilicon) and removing the conductive material where it overlies floating gates 33-35 and select gates 45, 51 so that conductive material remains between floating gates 33-35. Thus, control gates 81-84 may be considered to be self-aligned to floating gates 33-35. Control gates 81-84 are separated from floating gates 33-35 by an interlayer dielectric layer 103. Control gates 81-84 extend in the direction perpendicular to the cross section shown and control gates of neighboring strings are connected together as word lines. Thus, a word line is a conductive element that extends through multiple strings and forms control gates where it couples to floating gates of individual strings. A control gate may couple to the underlying substrate to form a transistor where it overlies a source/drain region. By biasing a control gate, a source/drain region may be made more conductive or less conductive. Thus, the source/drain region in a memory of this type (having a control gate close to the substrate, not just overlying the floating gate) may be considered as the channel of a transistor that has the control gate as its gate. In some cases, control gate bias may be sufficient to create an inversion layer that acts as a conductive source/drain region without requiring a source/drain implant.

When an architecture such as that of FIG. 1 is scaled to small dimensions (e.g. gate length less than 45 nanometers) certain device characteristics may be negatively impacted. Problems encountered as a result of diminished channel length may be referred to as "short channel effects." Short channel effects may be caused by implanted dopant in a source/drain region reducing the effective gate length and causing variation in effective gate length. This problem may be mitigated by reducing the amount of dopant implanted. However, less dopant results in higher resistivity and thus higher source/drain resistance, which is generally undesirable. Reduction in post implant anneal thermal cycle may also help to mitigate the problem, but does not generally eliminate short channel effects.

U.S. patent application Ser. Nos. 11/626,778 and 11/626,784 describe NAND flash memory arrays and methods of forming NAND flash memory arrays using fixed charge layer portions over source/drain regions. Such fixed charge layer portions may cause charge carriers in the underlying substrate to be drawn towards the substrate surface where they form an electrically conductive layer in the source/drain regions. Thus, source/drain regions may be made conductive, or more conductive, using fixed charge. Use of a fixed charge layer portion in this way may replace use of source/drain implantation or may be used in addition to source/drain implantation. An inversion layer is formed near the surface in the source/drain regions when an electrical charge is in close proximity, the electrical charge drawing charge carriers to the surface where they form a conductive layer. Such an electrical charge may cause a flat band voltage shift and inverts the surface. A fixed interface charge may induce enough band bending to invert the surface to form a conduction channel.

Figure 2:
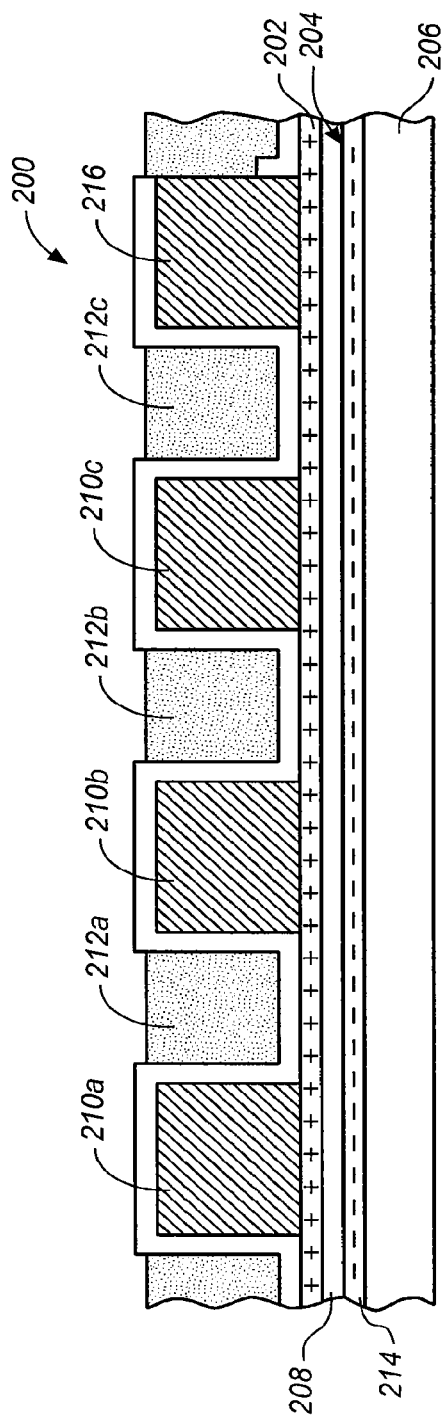
FIG. 2 shows a cross section of a portion of a NAND string according to an embodiment of the present invention having a fixed charge layer extending over a substrate surface, the fixed charge layer causing an oppositely charged layer to be formed in the substrate under both floating gates and control gates.

FIG. 2 shows a cross section of a NAND string 200 according to an embodiment of the present invention. A fixed charge layer 202 extends over a surface 204 of a substrate 206. Fixed charge layer 202 affects the band bending in the conductive channel regions, thereby altering their inversion threshold voltages. FIG. 2 shows a dielectric layer 208 extending between fixed charge layer 202 and substrate surface 204, though in other examples a fixed charge layer may directly overlie a substrate surface without an intervening dielectric layer. Floating gates 210a-c and control gates 212a-c are formed over fixed charge layer 202. Thus, in FIG. 2 fixed charge layer 202 extends under both control gates 212a-c and floating gates 210a-c to cause formation of a conductive layer 214 that is continuous along NAND string 200 in the cross section of FIG. 2 (subject to biases applied to overlying control gates 212a-c). Where conductive layer 214 extends under control gates 212a-c, conductive layer 214 forms conductive source/drain regions (instead of source/drain implantation or in addition to source/drain implantation). Where conductive layer 214 extends under floating gates 210a-c, conductive layer 214 forms the channels of the floating gate cells (instead of channel implantation or in addition to channel implantation). It will be understood that conductive layer 214 is also affected by control gates 212a-c and floating gates 210a-c so that conductive layer 214 may not be electrically conductive for all conditions. Conductive layer 214 also extends under select gate 216 where it forms the channel of a select transistor. In the example of FIG. 2, no separate source/drain implanted regions are needed because the source/drain regions are sufficiently conductive as a result of overlying fixed charge layer 202. Also, no separate channel (or threshold voltage) implant is needed because the channel is sufficiently conductive (has a desirable threshold voltage) as a result of overlying fixed charge layer 202. In other examples, a fixed charge layer may be provided in addition to one or more implants used to affect the conductivity of portions of a substrate.

In addition to being used in a NAND array as shown, a fixed charge layer according to an embodiment of the present invention may be formed in peripheral circuits that are connected to the NAND array. Various devices in peripheral circuits may have a fixed charge layer portion to provide an appropriate threshold voltage. For example, logic circuits may be provided on the same die as a NAND memory array and transistors within such logic circuits may include fixed charge layer portions overlying channel regions or other regions. In some cases, a controller and a NAND flash memory may be formed on the same die. Such a controller may include devices that have fixed charge layer portions.

The amount of charge contained in a given portion of a fixed charge layer (charge per unit area) may be selected according to the desired device characteristics. Also, the type of charge, positive or negative, may be chosen according to the desired result. For example, in an NMOS device, a fixed charge layer may have positive charge, which attracts negatively charged electrons towards the surface of the substrate in the channel region. This has the effect of reducing the threshold voltage of the device. Where the charge per unit area of the fixed charge layer is sufficiently high, the channel region may be inverted with no bias on the gate ($V_{GS}=0$) so that the device operates in depletion mode. Where a fixed charge layer containing negative charge is located over the channel region of an NMOS device, the threshold voltage of the device may be increased. In the case of PMOS devices, the effects of positive and negative charge over the channel are reversed.

Fixed charge layers may be formed in a variety of ways using a variety of materials. Materials may include Hf-rich Hafnium oxide, Zr-rich Zirconium oxide, Silicon nitride, nitrided Silicon dioxide or some combination of these or other materials. Fixed charge layers may be formed by plasma deposition, plasma nitrification, plasma oxidation, chemical vapor deposition, atomic layer deposition, rapid thermal processing, ion implantation or other techniques. A fixed charge layer may contain charge as-deposited or may have charge added after deposition (such as by plasma processing). In some cases, a fixed charge layer has charge as-deposited and subsequently has additional charge added. In one example, nitridation of a Silicon dioxide surface results in a nitrided Silicon dioxide that contains positive charge. A fixed charge layer may result where surface states are created on a substrate by a process such as a plasma deposition process. After a fixed charge layer is formed, the charge located in the fixed charge layer generally remains unchanged (fixed) during the lifetime of the device and is not significantly affected by voltages normally used in the device.

Figure 3:
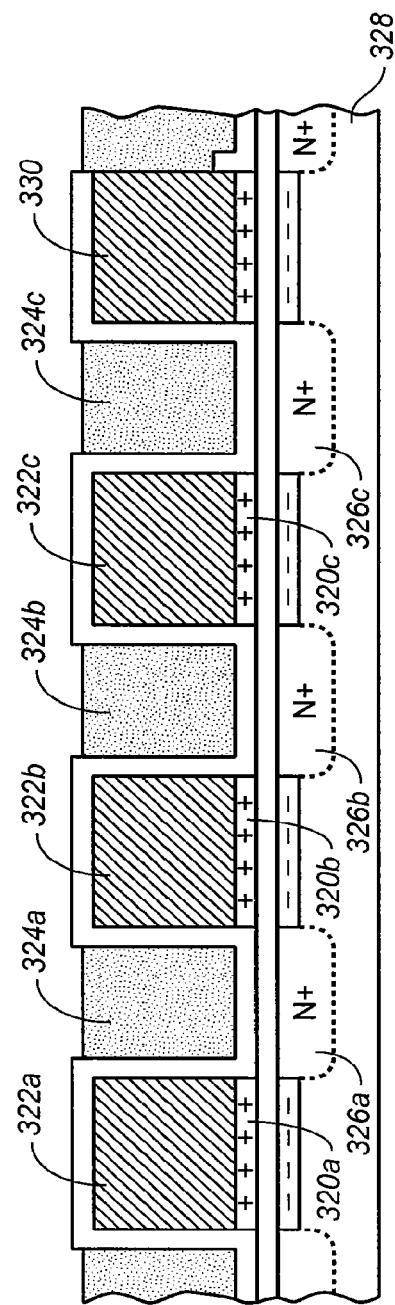
FIG. 3 shows an alternative embodiment of the present invention in which a NAND string has fixed charge under floating gates but does not have fixed charge under control gates.

A fixed charge layer may be patterned in some manner so that fixed charge layer portions remain only where desired. For example, as shown in FIG. 3, fixed charge layer portions 320a-d may be desired under floating gates 322a-c but not under control gates 324a-c. In this case, a separate source/drain implant may form source/drain regions 326a-c. A fixed charge layer may be deposited as a blanket layer over the entire substrate 328 and later etched to remove portions that are not needed. For example, floating gates 322a-c may be used as a mask layer to pattern the fixed charge layer, leaving fixed charge layer portions 320a-c only under floating gates 322a-c and under select gate 330. Other patterning schemes may also be used. While FIG. 3 indicates that no fixed charge remains under control gates 324a-c, in other cases the fixed charge layer may be reduced but not completely removed at these locations. Thus, some of the fixed charge layer may be removed, leaving a smaller amount of charge per unit area under control gates than under floating gates. Alternatively, additional processing (e.g. nitridation or implantation) may be performed to add charge to fixed charge layer portions under control gates. Other mask layers may also be provided to allow increased or decreased charge per unit area for particular regions. Such addition and removal of charge may be used to form fixed charge portions having a range of charge per unit area for different purposes.

Figure 4:
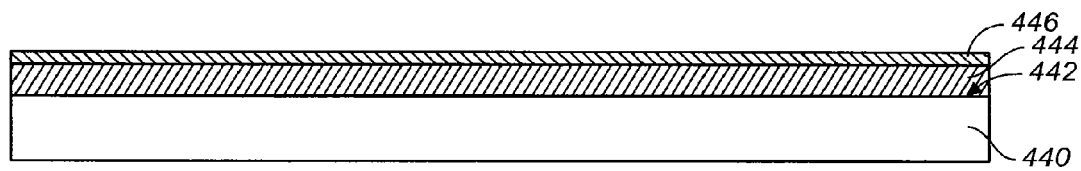
FIG. 4 shows a cross section of a NAND string at an intermediate stage of fabrication according to an embodiment of the present invention, where a nitrided dielectric layer is formed over the surface of a substrate.
Figure 5:
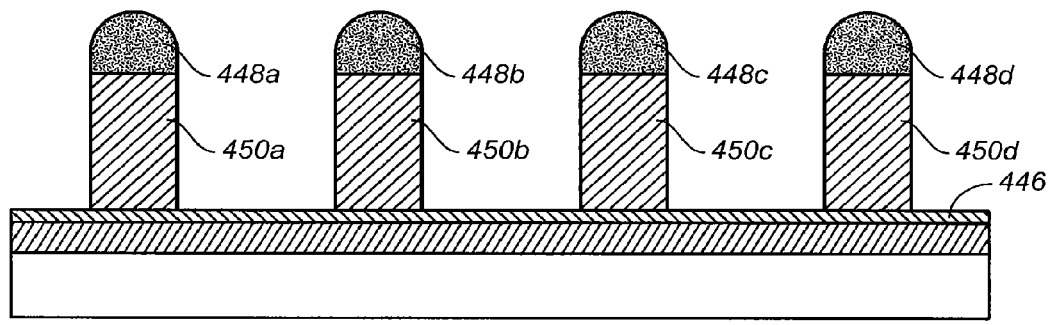
FIG. 5 shows the NAND string of FIG. 4 at a later stage of fabrication after conductive floating gate material is deposited and patterned using a hard mask.
Figure 6:
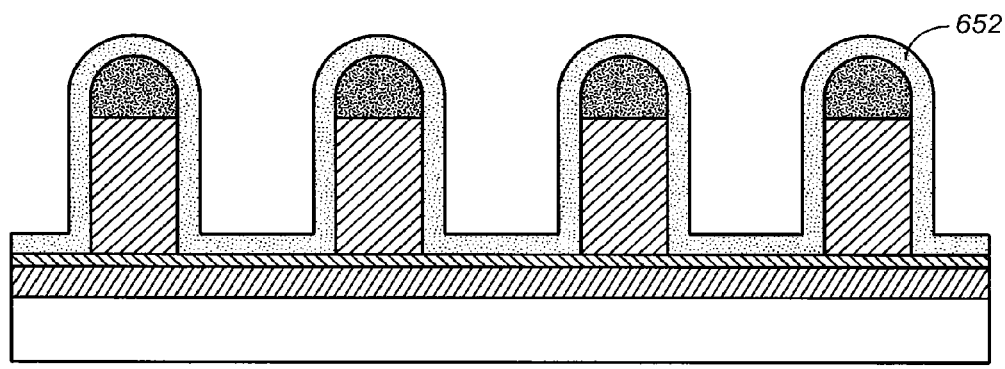
FIG. 6 shows the NAND string of FIG. 5 at a later stage of fabrication after an interlayer dielectric layer is deposited.

FIGS. 4-6 show a process for forming a NAND flash memory array, using a fixed charge layer, according to an embodiment of the present invention. Other processes may also be used to form a NAND flash memory array. FIG. 4 shows a portion of a substrate 440 at an early stage of fabrication of a NAND memory array. Substrate 440 is a Silicon substrate that may be lightly doped and have appropriately doped wells formed near a surface 442 to isolate the active region from the underlying bulk. A dielectric layer 444 is formed on surface 442 of substrate 440. In the example shown, dielectric layer 444 is a Silicon Dioxide (oxide) layer that is grown on substrate 440. Dielectric layer 444 may be grown in a furnace in a similar process to that used for forming a conventional tunnel oxide.

Subsequent to forming dielectric layer 444, a nitridation process is performed that nitrides dielectric layer 444. The plasma nitridation process may be performed using conventional plasma deposition equipment such as a Dual Plasma Nitride (DPN) chamber from Applied Materials, a Slot Plane Antenna (SPA) chamber from Tokyo Electron Limited (TEL), Modified Magnetron Typed (MMT) system from Hitachi Kokusai Electric or other plasma processing equipment. In one example a MMT system performs a nitridation process using the following conditions: Temperature=350 degrees Centigrade; Pressure=50 Pascals; Gas=Nitrogen (N2); RF Power=250 Watts. The result of the nitridation is that a fixed charge layer 446 is formed. Fixed charge layer 446 may include Silicon nitride and nitrided Silicon dioxide. Positively charged species are incorporated into nitrided surfaces. Generally, the charge incorporated into nitrided surfaces in this manner is not free to move because the nitrided surface is not electrically conductive, so the charge remains fixed in place. Thus, a nitrided surface formed in this way may be considered a fixed charge layer. Nitridation of dielectric layer 444 may at least partially consume dielectric layer 444. While FIG. 4 shows dielectric layer 444 remaining after nitridation, in other cases no unnitrided dielectric may remain so that a fixed charge layer is formed directly over the substrate surface. In some cases, the location of the fixed charge within a dielectric layer may be controlled by adjusting a bias voltage applied to the substrate (or to a chuck on which the substrate sits) during plasma nitridation. Thus, a fixed charge layer may be formed directly on the substrate surface or at a chosen distance from the substrate surface.

In an alternative embodiment, a fixed charge layer may be formed by implanting ions into a dielectric layer, such as a Silicon Dioxide layer. The depth of an implanted layer may be controlled by adjusting implant energy so that the distance between the fixed charge layer and the substrate may be chosen. In an alternative embodiment, a fixed charge layer is formed by deposition of a material that contains a fixed charge as-deposited, without requiring additional processing such as plasma processing or implantation as previously described. While these techniques may be considered as alternative methods of forming a fixed charge layer, they may also be combined so that, for example, a layer may be deposited containing a fixed charge as-deposited and may then be subject to additional processing (e.g. nitridation or implantation) to add more charge. Charge may also be removed, for example by etching away some or all of the fixed charge layer.

Subsequent to the nitridation of dielectric layer 444, a layer of conductive floating gate material is deposited over fixed charge layer 446. In the present example, doped polysilicon is used as the floating gate material. The floating gate material is subsequently patterned using a hard mask pattern. A hard mask pattern may be formed using a conventional lithographic process where a photoresist layer is patterned and the pattern transferred to a hard mask layer. This produces hard mask portions that are as small as the minimum feature size of the lithographic process used. Alternatively, a spacer scheme may be used to form hard mask portions that are smaller than the minimum feature size of the lithographic process. Examples of such spacer schemes are provided in U.S. Pat. No. 6,888,755. FIG. 5 shows hard mask portions 448*a-d* formed using a spacer scheme and subsequently used to pattern the floating gate layer into floating gate portions 450*a-d*. In particular, the floating gate layer is patterned by performing an anisotropic etch while hard mask layer portions 448*a-d* are in place over the floating gate layer. The etch stops at the fixed charge layer 446. An etch may be used that is selective to polysilicon over nitrided Silicon Dioxide so that little or no etching of the nitrided dielectric layer occurs.

In an alternative embodiment, a fixed charge layer is also etched at this point. Nitrided dielectric material of a fixed charge layer may be completely removed where it is exposed between remaining portions of floating gate material, or may be only partially removed. By performing partial removal, the fixed charge per unit area in the exposed portions of the fixed charge layer may be reduced to a chosen level. Thus, the fixed charge per unit area under remaining floating gate material may be greater than the fixed charge per unit area elsewhere. Complete removal of exposed fixed charge layer portions may be followed by deposition of replacement fixed charge layer portions. For example, where a nitrided dielectric layer is used to fix positive charge under floating gates, it may be desirable to have negative charge between floating gates. So, the nitrided dielectric layer is removed in these areas and is replaced by another fixed charge layer that contains negative charge. Charge may also be added to exposed portions of a fixed charge layer at this point if desired so that the charge per unit area is increased over source/drain regions. For example, additional nitridation may be performed, or ions may be implanted to alter the charge per unit area in exposed portions of a fixed charge layer. It should be noted that remaining floating gate portions 450*a-d* of FIG. 5 may be individual floating gates at this point if Shallow Trench Isolation (STI) structures are already formed (STI structures separating floating gates in the direction perpendicular to the cross section shown). Alternatively, separation of remaining floating gate portions 450*a-d* into individual floating gates may occur later when STI structures are formed.

Subsequent to patterning the floating gate material, an interlayer dielectric layer 652 is formed over the structure of FIG. 5 as shown by FIG. 6. In the present example, the interlayer dielectric layer 652 is a compound layer formed of a Silicon Dioxide (Oxide) layer, followed by a Silicon Nitride (Nitride) layer, followed by a second Silicon Dioxide (Oxide) layer. Such an Oxide-Nitride-Oxide (ONO) layer provides insulation between floating gates and control gates. In the present example a low thermal cycle ONO is used so that there is little or no diffusion of charge from the fixed charge layer. Other dielectric materials may also be used to form an interlayer dielectric layer in some cases.

Figure 7:
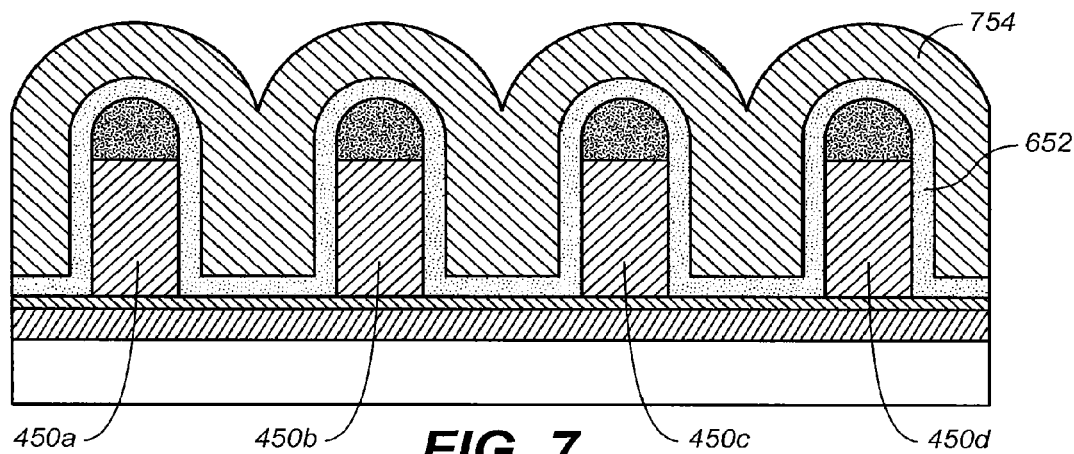
FIG. 7 shows the NAND string of FIG. 6 at a later stage of fabrication after conductive control gate material is deposited to fill gaps between remaining floating gate material.

Subsequent to formation of interlayer dielectric layer 652 an electrically conductive control gate material 754 is deposited as shown in FIG. 7. In the present example, the control gate material 754 is doped polysilicon (similar to the floating gate material), though other conductive materials may also be used. Control gate material 754 is deposited to a thickness that is sufficient to fill the gaps between remaining floating gate portion 450*a-d*.

Figure 8:
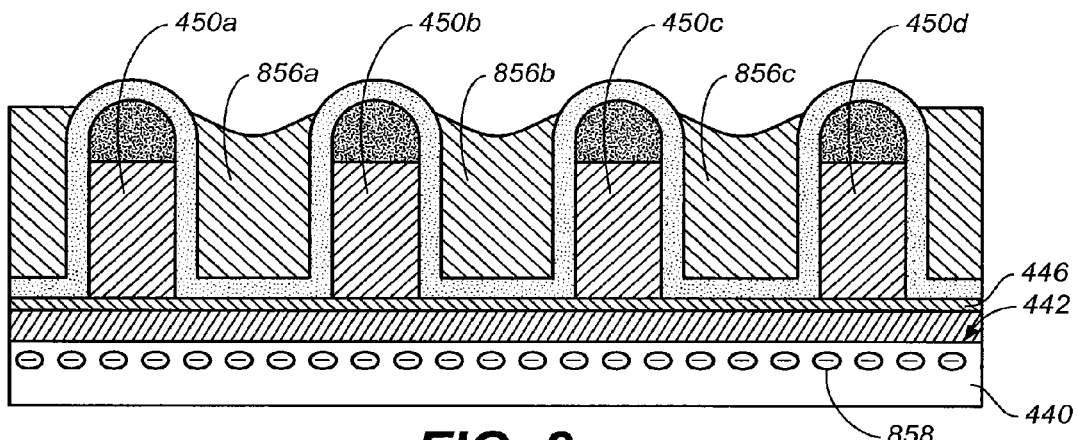
FIG. 8 shows the NAND string of FIG. 7 at a later stage of fabrication after the conductive control gate material is etched back to leave control gates in gaps between floating gates.

Subsequent to deposition of control gate material 754, excess control gate material is removed as shown in FIG. 8. In the present example, removal of excess material is achieved by etching back control gate material 754. The removal of excess control gate material results in the formation of separate control gates 856*a-c* between floating gates 450*a-d*. In other examples, Chemical Mechanical Polishing (CMP) or other processes may be used to remove excess control gate material. In some cases, STI structures are formed at this point to isolate adjacent NAND strings in the word line direction. In this case, word lines extending over control gates are added to connect control gates in the word line direction. Such word lines may be formed by conventional patterning of conductive material. In the example shown, no additional word lines are needed because control gates 856*a-c* connect from one string to another to form word lines. FIG. 8 also shows a negative charge layer 858 that extends under floating gates 450*a-c* and control gates 856*a-c* of the NAND string. A negative charge layer 858 is formed by electrons that are attracted to surface 442 of substrate 440 by positive charge in overlying fixed charge layer 446.

Figure 9:
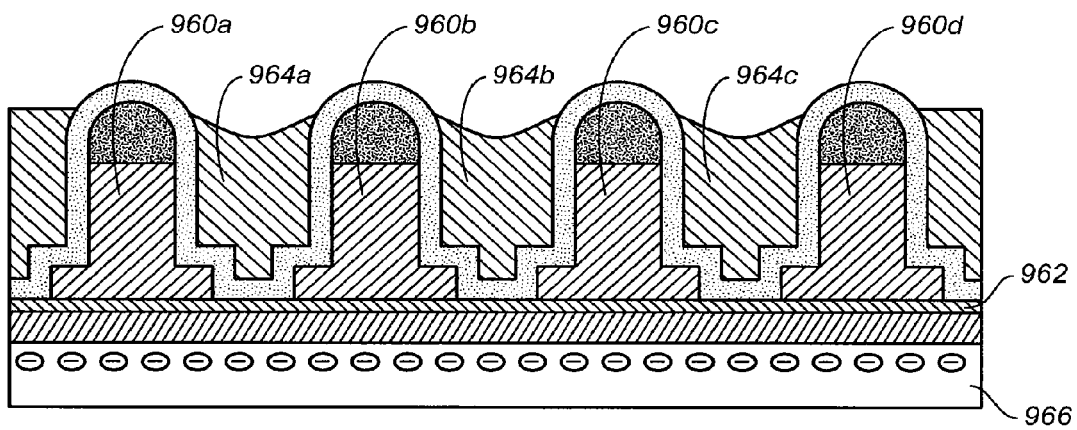
FIG. 9 shows a cross section of a NAND string that includes floating gates having an inverted-T shape in cross section along the string direction.

FIG. 9 shows an alternative structure in which floating gates 960*a-d* in a NAND string are formed having an inverted-T shape in cross section. Examples of such floating gates and their formation are described in US Patent Application Publication No. 20050199939 and U.S. Pat. No. 7,026,684. FIG. 9 shows a nitrided dielectric forming a fixed charge layer 962 underlying both floating gates 960*a-d* and control gates 964*a-c* as before so that fixed charge affects underlying substrate 966. Subsequent to forming fixed charge layer 962, floating gates 960*a-c* and control gates 964*a-c* may be formed according to any suitable scheme to form floating gates having an inverted-T shape.

Figure 10:
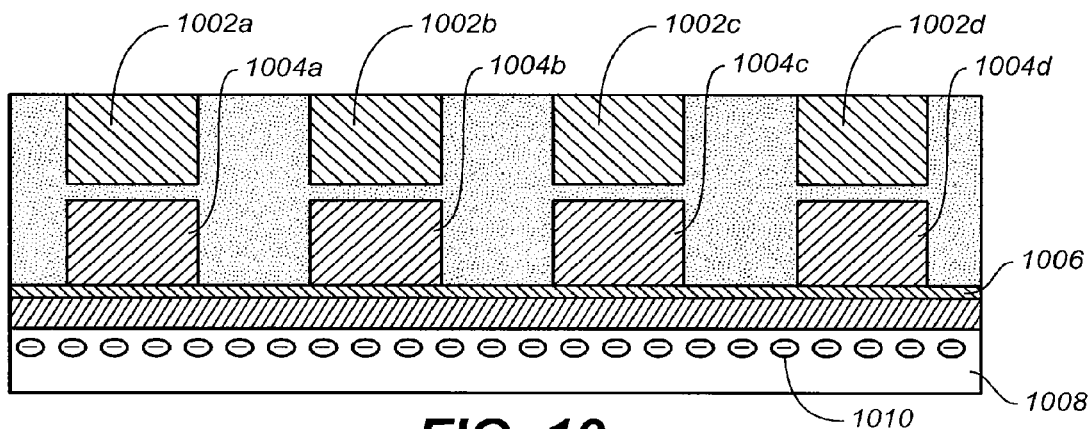
FIG. 10 shows a cross section of an alternative NAND string with control gates over floating gates.

A fixed charge layer may be incorporated in any integrated circuit (memory or other circuit) by performing nitridation or other processing to place charge in a gate dielectric layer. Subsequent processing may be carried out as before, or with some adjustment for thermal budget etc. In the example of FIG. 10, a NAND memory string 1000 has control gates 1002*a-d* lying over floating gates 1004*a-d* (one control gate coupled to a floating gate). A fixed charge layer 1006 holding positive charge extends across substrate 1008 so that fixed charge layer portions are present on substrate 1008 under floating gates 1004*a-d* and also between floating gates 1004*a-d*. The presence of fixed charge layer 1006 causes electrons to be drawn to the underlying channel and source/drain regions where they form a layer of negative charge 1010 as shown. Source/drain and channel implants may also be provided in this type of structure to provide added control of threshold voltage and to reduce resistance of source/drain regions.

In other examples, fixed charge layer portions are used in devices that do not include floating gates, such as logic devices used in peripheral areas of memory arrays. The use of fixed charge in such locations may be in place of, or in addition to, the use of implanted dopants to control threshold voltage. In some nonvolatile memory cells, charge trapping structures are used instead of conductive floating gates so that the state of a cell depends on the charge trapped in such a structure. Fixed charge layers may be used under such structures in a similar manner to their use under conductive floating gates.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of forming a NAND flash memory array comprising:
    forming a fixed charge layer that extends over at least a portion of a surface of a substrate;
    forming a plurality of gates for devices over the fixed charge layer, wherein the fixed charge layer induces inversion layers in the substrate below the gates, the fixed charge layer has a charge per unit area that is sufficiently high to invert a channel region below each of the gates without a bias voltage applied to the gates so that the devices operate in depletion mode.

2. The method of claim 1 wherein forming a fixed charge layer includes forming the fixed charge layer in a dielectric material that extends over the surface of the substrate.

3. The method of claim 1 wherein forming the fixed charge layer includes implanting ions into a dielectric layer.

4. A method of forming a NAND flash memory array comprising:
    forming a fixed charge layer that extends over a surface of a substrate;
    forming a plurality of floating gates overlying the fixed charge layer; and
    forming a plurality of conductive source/drain regions in areas of the substrate between floating gates, the source/drain regions connecting memory cells in series as a NAND string, the forming a fixed charge layer includes adding charge to control the threshold voltage of the memory cells.

5. The method of claim 4 wherein the fixed charge layer reduces the threshold voltage of the memory cells.

6. The method of claim 5 wherein the fixed charge layer has a positive charge.

7. The method of claim 5 wherein the fixed charge layer has a negative charge.

8. The method of claim 4 wherein the fixed charge layer increases the threshold voltage of the memory cells.

9. The method of claim 8 wherein the fixed charge layer has a positive charge.

10. The method of claim 8 wherein the fixed charge layer has a negative charge.

11. The method of claim 4 further comprising forming an individual control gate overlying each of the floating gates.

12. The method of claim 4 further comprising forming an individual control gate extending between neighboring ones of the plurality of floating gates.

13. A method of forming a NAND flash memory array comprising:
    forming a first fixed charge layer that extends over a surface of a substrate;
    forming a plurality of floating gates overlying the fixed charge layer;
    forming a plurality of conductive source/drain regions in areas of the substrate between floating gates, the source/drain regions connecting memory cells in series as a NAND string;
    removing portions of the first fixed charge layer between the floating gates; and
    forming a second fixed charge layer having a negative charge between the plurality of floating gates after removing portions of the first fixed charge.

14. The method of claim 13 wherein the first fixed charge layer is formed in a dielectric material that extends over the surface of the substrate.

15. The method of claim 13 wherein the conductive source/drain regions are formed, at least in part, by the second fixed charge layer.

16. The method of claim 13 wherein forming the first fixed charge layer includes implanting ions into a dielectric layer.

17. The method of claim 13 wherein forming the first fixed charge layer includes performing a plasma nitridation process on a dielectric layer.

18. The method of claim 4, wherein the amount of charge that is added achieves a desired threshold voltage.

19. The method of claim 4, wherein no channel implant is used when forming the memory cells.

* * * * *